(12) United States Patent
Abdallah et al.

(10) Patent No.: US 7,704,670 B2
(45) Date of Patent: Apr. 27, 2010

(54) HIGH SILICON-CONTENT THIN FILM THERMOSETS

(75) Inventors: David J. Abdallah, Bernardsville, NJ (US); Ruzhi Zhang, Pennington, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 467 days.

(21) Appl. No.: 11/425,817

(22) Filed: Jun. 22, 2006

(65) Prior Publication Data

US 2008/0008954 A1 Jan. 10, 2008

(51) Int. Cl.
*G03F 7/00* (2006.01)
*G03F 7/004* (2006.01)

(52) U.S. Cl. .................. 430/270.1; 430/311; 430/330; 430/331; 430/913

(58) Field of Classification Search .................. 430/311, 430/270.1, 913
See application file for complete search history.

(56) References Cited

U.S. PATENT DOCUMENTS

| | | | |
|---|---|---|---|
| 2,310,605 A | 2/1943 | Barnett | |
| 2,625,525 A | 1/1953 | Lynch | |
| 2,703,793 A | 3/1955 | Naylor | |
| 2,778,812 A | 1/1957 | Dreisbach et al. | |
| 2,779,749 A | 1/1957 | Wicklatz | |
| 2,794,014 A | 5/1957 | Dreisbach et al. | |
| 2,899,412 A | 8/1959 | Caldwell et al. | |
| 2,943,077 A | 6/1960 | de Jong et al. | |
| 3,313,785 A | 4/1967 | Zutty | |
| 3,318,844 A | 5/1967 | Krantz | |
| 3,474,054 A | 10/1969 | White | |
| 3,663,507 A | 5/1972 | Vogel et al. | |
| 3,884,696 A | 5/1975 | Bowden et al. | |
| 3,890,287 A | 6/1975 | Moore et al. | |
| 3,893,127 A | 7/1975 | Kaplan et al. | |
| 3,898,350 A | 8/1975 | Gipstein et al. | |
| 3,935,331 A | 1/1976 | Poliniak et al. | |
| 3,935,332 A | 1/1976 | Poliniak et al. | |
| 4,045,318 A | 8/1977 | Himica et al. | |
| 4,097,618 A | 6/1978 | Poliniak | |
| 4,126,712 A | 11/1978 | Poliniak et al. | |
| 4,153,741 A | 5/1979 | Poliniak et al. | |
| 4,200,729 A | 4/1980 | Calbo | |
| 4,251,665 A | 2/1981 | Calbo | |
| 4,267,257 A | 5/1981 | Poliniak et al. | |
| 4,289,845 A | 9/1981 | Bowden et al. | |
| 4,341,861 A | 7/1982 | Pampalone | |
| 4,355,094 A | 10/1982 | Pampalone et al. | |
| 4,393,160 A | 7/1983 | Pampalone | |
| 4,396,702 A | 8/1983 | Desai et al. | |
| 4,396,704 A | 8/1983 | Desai et al. | |
| 4,397,938 A | 8/1983 | Desai et al. | |
| 4,397,939 A | 8/1983 | Kilichowski | |
| 4,398,001 A | 8/1983 | Cheng et al. | |
| 4,405,776 A | 9/1983 | Pampalone et al. | |
| 4,409,317 A | 10/1983 | Shiraishi | |
| 4,491,628 A | 1/1985 | Ito et al. | |
| 4,504,372 A | 3/1985 | Kirchmayr et al. | |
| 4,751,168 A | 6/1988 | Tsuchiya et al. | |
| 4,808,697 A | 2/1989 | Drent | |
| 4,985,342 A | 1/1991 | Muramoto et al. | |
| 4,996,136 A | 2/1991 | Houlihan et al. | |
| 5,072,024 A | 12/1991 | Cesa et al. | |
| 5,135,838 A | 8/1992 | Houlihan et al. | |
| 5,187,019 A | 2/1993 | Calbo et al. | |
| 5,200,544 A | 4/1993 | Houlihan et al. | |
| 5,298,367 A | 3/1994 | Hoessel et al. | |
| 5,314,978 A | 5/1994 | Kim et al. | |
| 5,350,660 A | 9/1994 | Urano et al. | |
| 5,384,376 A | 1/1995 | Tunney et al. | |
| 5,457,003 A | 10/1995 | Tanaka et al. | |
| 5,728,506 A | 3/1998 | Kometani | |
| 5,843,624 A | 12/1998 | Houlihan et al. | |
| 5,853,808 A | 12/1998 | Arkles et al. | |
| 5,871,872 A | 2/1999 | Matijevic et al. | |
| 6,069,259 A | 5/2000 | Crivello | |
| 6,087,064 A | 7/2000 | Lin et al. | |
| 6,139,920 A | 10/2000 | Smith et al. | |
| 6,225,019 B1 | 5/2001 | Matsuda et al. | |
| 6,265,073 B1 * | 7/2001 | Nakamura et al. | 428/413 |
| 6,340,734 B1 | 1/2002 | Lin et al. | |
| 6,420,088 B1 | 7/2002 | Angelopoulos et al. | |

(Continued)

FOREIGN PATENT DOCUMENTS

EP 1 178 354 A1 2/2002

(Continued)

OTHER PUBLICATIONS

Imae et al, Unique photoluminescence property of a novel perfectly carbazole-substituted POSS, Journal of Materials Chemistry vol. 15, pp. 4581-4583 (2005).*

(Continued)

*Primary Examiner*—Amanda C. Walke
(74) *Attorney, Agent, or Firm*—Sangya Jain; Alan P. Kass

(57) ABSTRACT

High silicon-content resin composition that can be used to form thin film thermosets, useful in forming low k dielectric constant materials and as well as hard mask materials with anti-reflective properties for the photolithography industry are disclosed.

25 Claims, No Drawings

U.S. PATENT DOCUMENTS

| | | | |
|---|---|---|---|
| 6,447,980 B1 | 9/2002 | Rahman et al. | |
| 6,479,212 B1 | 11/2002 | Matsuda et al. | |
| 6,515,073 B2 | 2/2003 | Sakamoto et al. | |
| 6,576,393 B1 | 6/2003 | Sugita et al. | |
| 6,723,488 B2 | 4/2004 | Kudo et al. | |
| 6,730,454 B2 | 5/2004 | Pfeiffer et al. | |
| 6,737,117 B2 | 5/2004 | Boisvert et al. | |
| 6,770,726 B1 | 8/2004 | Arkles et al. | |
| 6,773,864 B1 | 8/2004 | Thackeray et al. | |
| 6,790,587 B1 | 9/2004 | Feiring et al. | |
| 6,803,171 B2* | 10/2004 | Gronbeck et al. | 430/270.1 |
| 6,818,250 B2 | 11/2004 | George et al. | |
| 6,818,258 B2 | 11/2004 | Kaneko et al. | |
| 6,824,947 B2 | 11/2004 | Ishizuka et al. | |
| 6,849,377 B2 | 2/2005 | Feiring et al. | |
| 6,866,984 B2 | 3/2005 | Jung et al. | |
| 6,914,114 B2* | 7/2005 | Baldwin et al. | 528/43 |
| 6,916,590 B2 | 7/2005 | Kaneko et al. | |
| 6,939,664 B2* | 9/2005 | Huang et al. | 430/270.1 |
| 6,969,753 B2* | 11/2005 | Baldwin et al. | 528/31 |
| 7,033,729 B2 | 4/2006 | Jung et al. | |
| 7,108,212 B2 | 9/2006 | Latham | |
| 7,108,958 B2 | 9/2006 | Guerrero | |
| 7,202,013 B2 | 4/2007 | Ogihara et al. | |
| 7,223,517 B2* | 5/2007 | Babich et al. | 430/270.1 |
| 2001/0034427 A1 | 10/2001 | Jung et al. | |
| 2001/0036998 A1 | 11/2001 | Sakamoto et al. | |
| 2002/0128388 A1 | 9/2002 | Kennedy et al. | |
| 2003/0120018 A1 | 6/2003 | Baldwin et al. | |
| 2003/0198877 A1 | 10/2003 | Pfeiffer et al. | |
| 2003/0209515 A1 | 11/2003 | Pavelchek | |
| 2003/0219673 A1 | 11/2003 | Tao et al. | |
| 2003/0219678 A1 | 11/2003 | Harada et al. | |
| 2004/0013980 A1 | 1/2004 | Hatakeyama et al. | |
| 2004/0137241 A1 | 7/2004 | Lin et al. | |
| 2004/0176488 A1* | 9/2004 | Mukherjee et al. | 521/61 |
| 2004/0247900 A1 | 12/2004 | Ogihara et al. | |
| 2004/0253461 A1 | 12/2004 | Orihara et al. | |
| 2004/0253535 A1* | 12/2004 | Cameron et al. | 430/270.1 |
| 2005/0031964 A1 | 2/2005 | Babich et al. | |
| 2005/0054216 A1 | 3/2005 | Daley | |
| 2005/0058929 A1 | 3/2005 | Kennedy et al. | |
| 2005/0118541 A1 | 6/2005 | Ahn et al. | |
| 2005/0123760 A1* | 6/2005 | Cammack et al. | 428/403 |
| 2005/0277058 A1 | 12/2005 | Iwabuchi et al. | |
| 2006/0058468 A1 | 3/2006 | Wu et al. | |
| 2006/0105181 A1 | 5/2006 | Lin et al. | |
| 2006/0141400 A1 | 6/2006 | Hirayama et al. | |
| 2006/0194916 A1 | 8/2006 | Zhong et al. | |
| 2006/0292488 A1 | 12/2006 | Takayama et al. | |
| 2007/0042289 A1 | 2/2007 | Thackeray et al. | |
| 2007/0057253 A1 | 3/2007 | Gronbeck et al. | |
| 2007/0117044 A1 | 5/2007 | Ogihara et al. | |
| 2007/0117411 A1 | 5/2007 | Ogihara et al. | |
| 2007/0238300 A1 | 10/2007 | Ogihara et al. | |
| 2007/0298349 A1 | 12/2007 | Zhang et al. | |
| 2008/0026322 A1 | 1/2008 | Ogihara et al. | |
| 2008/0196626 A1 | 8/2008 | Wu et al. | |
| 2008/0199789 A1 | 8/2008 | Abdallah et al. | |

FOREIGN PATENT DOCUMENTS

| | | |
|---|---|---|
| EP | 1 566 836 A1 | 8/2005 |
| GB | 744264 | 2/1956 |
| GB | 757046 | 9/1956 |
| GB | 757046 A | 9/1956 |
| GB | 744264 A | 2/1958 |
| GB | 1118950 | 7/1968 |
| JP | 5-125187 A | 5/1993 |
| JP | 2002-179793 A | 2/2002 |
| JP | 2005-48152 A | 2/2005 |
| JP | 2005-128509 A | 5/2005 |
| JP | 2005-221534 A | 8/2005 |
| KR | 10-2007-002602 | 1/2007 |
| WO | WO 00/77575 | 12/2000 |
| WO | WO 2004/044025 A2 | 5/2004 |
| WO | WO 2004/046224 A1 | 6/2004 |
| WO | WO 2004/113417 A1 | 12/2004 |
| WO | WO 2005007747 A2 * | 1/2005 |
| WO | WO 2005/037907 A1 | 4/2005 |
| WO | WO 2005/049681 A2 | 6/2005 |
| WO | WO 2006/065310 A2 | 6/2006 |
| WO | WO 2006/065321 A1 | 6/2006 |
| WO | WO 2006/107029 A1 | 10/2006 |

OTHER PUBLICATIONS

Office Action dated mailed Feb. 4, 2008 from U.S. Appl. No. 11/372,680.

English Language Abstract of JP 2002-179793 A.

Jiang, Y. et al., "Design and synthesis of thermally labile polymers for microelectronics: poly(vinyl tert-butyl carbonate sulfone)", Macromolecules (1991) vol. 24, No. 12, pp. 3528-3532.

Jiang, Y. et al., "Poly(vinyl-tl-butyl carbonate) synthesis and thermolysis to poly(vinyl alcohol)", Polymer Bulletin (1987) vol. 17, pp. 1-6.

Houlihan, F. et al., "Phase transfer catalysis in the tert-butyloxycarbonylation of alcohols, phenols, enols, and thiols with di-tert-butyl dicarbonate", Can. J. Chem. (1985), vol. 63, pp. 153-162.

Pages 41 and 42 from Gelest Reactive Silicones Catalog, copyright 2004.

Pages 15 to 24 of Jun. 5, 2006 Chemical & Engineering News.

Office Action date mailed Feb. 17, 2009 for U.S. Appl. No. 11/425,813.

Notificatio of Transmittal of the International Search report and Written Opinion of the International Searching Authority, or the Declaration (Form PCT/ISA/220), the International Search Report (Form PCT/ISA/210), and the Written Opinion of the International Search Authority (Form PCT/ISA/237) for PCT/IB2007/001982.

Notification of Concerning Transmittal of International Preliminary Report on Patentability (Chapter I of the Patent Cooperation Treaty) (From PCT/IIB/326) and International Preliminary Report on Patentability (Form PCT/IB/373) for PCT/IB2007/001982.

Notification of Transmittal of the International Search Report and the Written Opinion of the International Searching Authority, or the Declaration (Form PCT/ISA/220), International Search Report (Form PCT/ISA/210), and Written Opinion of the International Searching Authority (Form PCT/ISA/237) for PCT/IB2008/000517.

B. Arkles et al., "High Density Silicon Dioxide Coatings by UV and Thermal Processing", Silicones in Coatings III, Mar. 28-30, 2000, Barcelona, Spain.

B. Arkles et al., "Staged Development of Modified Silicon Dioxide Films", Journal of Sol-Gel Science and Technology vol. 8, pp. 465-469 (1997).

Y. Huo et al., "Synthesis and Properties of Hybrid Organic-Inorganic Materials Containing Covalently Bonded Luminescent Polygermanes", Chem. Mater. vol. 17, pp. 157-163 (2005).

Kennedy et al., "Organosiloxane based Bottom Antireflective Coatings for 193nm Lithography", SPIE vol. 5039, pp. 929-939 (2003).

S. Kodama et al., "Synthesis of Novel Fluoropolymer for 157nm Photoresists by Cyclo-polymerization", SPIE vol. 4690, pp. 76-83 (2002).

Q. Pan et al., "Spin-on-glass thin films prepared from a novel polysilsesquioxane by thermal and ultraviolet-irradiation methods", Thin Solid Films vol. 345, pp. 244-254.

Chang et al., "A Novel Switchable BARC (SBARC) and Process to Improve Pattern Collapse and Defect Control", SPIE vol. 6153, Part 1, pp. 61530M-1-61530M-10 (2006).

English Language Abstract of KR 10-2007-002602.

Notification of Transmittal of the International Search Report and the Written Opinion of the International Searching Authority, or the Declaration (Form PCT/ISA/220), International Search Report (Form PCT/ISA/210), and Written Opinion of the International Searching Authority (Form PCT/ISA/237) for PCT/IB2008/003523 dated Jun. 25, 2009.

Office Action date mailed Oct. 13, 2009 for U.S. Appl. No. 11/425,813.

Office Action date mailed Jun. 23, 2009 for U.S. Appl. No. 11/676,673.

Baney et al., "Silsesquioxanes", Chemical Reviews, American Chemical Society 1995, pp. 1409-1430.

Houlihan et al., "Phase transfer catalysis in the tert-butyloxycarbonylation of alcohols, phenols, nols, and thiols with di-tert-butyl dlcarbonate", Can. J. Chem. 1985, vol. 63, pp. 153-162.

Jiang et al., "Design and Synthesis of Thermally Labile Polymers for Microelectronics. Poly(vinyl tert-butyl carbonate sulfone)", Macromolecules 1991, vol. 24, No. 12, pp. 3528-3532.

Jiang, et al., "Poly(vinyl-t-butyl carbonate) synthesis and thermolisys to poly (vinyl alcohol)", Polymer Bulletin 1987, vol. 17, pp. 1-6.

Jerry March, Advanced Organic Chemistry; Reactions, Mechanisms, and Structure, Second Edition, McGraw-Hill Book Company 1977, New York, NY 1977, pp. 809, 810, and 1302.

Notification of Transmittal of the International Search Report and the Written Opinion of the International Searching Authority or the Declaration (Form PCT/ISA/220), International Search Report (Form PCT/ISA/210), and Written Opinion of the International Searching Authority (Form PCT/ISA/237) for PCT application PCT/IB2007/01846.

Derwent Abstract XP-002147398.

English Language Abstract of JP 5-125187 A.

English Language Abstract of JP 2006-312717 A.

Machine Language English Translation of JP 5-125187 A from Japanese Patent Office.

Machine Language English Translation of JP 2006-312717 A from Japanese Patent Office.

\* cited by examiner

HIGH SILICON-CONTENT THIN FILM THERMOSETS

BACKGROUND OF THE INVENTION

This invention relates generally to high silicon-content resin composition that can be used to form thin film thermosets, useful in forming low k dielectric constant materials and as well as hard mask materials with anti-reflective properties for the photolithography industry.

As the dimensions of microelectronic devices become smaller, the importance of fully exploiting the physical properties of the materials used in their manufacture becomes more essential. This is particularly true of the dielectric materials that are used to insulate metal lines, vias and electronic components from one another because of the contributions to capacitance that these materials make. Silicon dioxide has been employed within the industry as a dielectric material for the manufacture of devices for nearly three decades, but may become less suitable in the future because of its relatively high dielectric constant ($k\sim4.1$). Recently, however, siloxanes have made inroads into microlithography fabrication with low dielectric constant insulating layers and pattern transfer hard masks that exhibit antireflective properties.

Additionally, in current conventional semiconductor manufacturing, in order to prevent light reflection from being transmitted through the photo-resist, reflected off the substrate and back into the photoresist, where it can interfere with incoming light and so result in the uneven exposure of the photoresist, conventionally one or more antireflective layers may be deposited before the photoresist is deposited or spun on. In the absence of an antireflection coating, interference of reflected and incident exposure radiation can cause standing wave effects that distort the uniformity of the radiation through the thickness of the photoresist layer. Variations in reflectivity throughout the entire imaged areas can cause undesirable line width variation for features which are designed to have similar dimensions.

SUMMARY OF THE INVENTION

The present invention relates to a composition comprising: (a) a polymer comprising at least one repeating unit of formula $((A)_j R_1 SiO_{(3-j)/2})$ and at least one repeating unit of formula $((A)_k R_2 SiO_{(3-k)/2})$, where each $R_1$ individually is the same or different chromophore which absorbs at any actinic wavelength; each $R_2$ is individually selected from hydrogen, alkyl, alkenyl, cycloalkyl, and aralkyl; each A is an unreacted functional group of a monomer which forms either of the above repeating units; j and k are each integers that fall within the range $0 \leq j \leq 1$ and $0 \leq k \leq 1$, the ratio of $R_1$ to $R_2$ being from about 1:99 to about 60:40; (b) a halide source; and (c) a solvent. The polymer can also comprise an additional unit of formula $(R_f)_w(R_g)_z SiO_{(4-w-z)/2}$, where $R_f$ and $R_g$ are each individually selected from $R_1$ and $R_2$; and w and z are each integers within the limits $0 \leq (w \text{ or } z) \leq 2$ with the proviso that $(4-w-z)$ does not equal 0. A method for forming an image on a substrate as well as an article of manufacture of a substrate, the inventive composition, and a photoresist are also provided.

DETAILED DESCRIPTION OF THE INVENTION

The present invention relates to a composition comprising: (a) a polymer comprising at least one repeating unit of formula $((A)_j R_1 SiO_{(3-j)/2})$ and at least one repeating unit of formula $((A)_k R_2 SiO_{(3-k)/2})$, where each $R_1$ individually is the same or different chromophore which absorbs at any actinic wavelength; each $R_2$ is individually selected from hydrogen, alkyl, alkenyl, cycloalkyl, and aralkyl; each A is an unreacted functional group of a monomer which forms either of the above repeating units; j and k are each integers that fall within the range $0 \leq j \leq 1$ and $0 \leq k \leq 1$, the ratio of $R_1$ to $R_2$ being from about 1:99 to about 60:40; (b) a halide source; and (c) a solvent. The polymer can also comprise an additional unit of formula $(R_f)_w(R_g)_z SiO_{(4-w-z)/2}$, where $R_f$ and $R_g$ are each individually selected from $R_1$ and $R_2$; and w and z are each integers within the limits $0 \leq (w \text{ or } z) \leq 2$ with the proviso that $(4-w-z)$ does not equal 0. A method for forming an image on a substrate as well as an article of manufacture of a substrate, the inventive composition, and a photoresist are also provided.

The polymer of the present invention contains repeating units $((A)_j R_1 SiO_{(3-j)/2})$ and $((A)_k R_2 SiO_{(3-k)/2})$, which be prepared by methods known to those skilled in the art, for example, by hydrolytic condensation reactions of trifunctional organosilicon monomers such as $RSiA_3$, $RSiCl_3$, a silane ester $(RSi(OR_x)_3$, where $R_x$ can be an alkyl group, $RSi(acyloxy)_3$, or $RSi(alkylketoxime)_3$, or a hydrolyzed form of the above, where R can be $R_1$ or $R_2$. Further information on preparing polymers of the present invention can be found in U.S. Pat. Nos. 5,290,354; 5,320,868; and 6,770,726. These reactions can form small oligomers, complex resins and networks.

Examples of $R_1$, chromophores, include, but are not limited to, unsubstituted and substituted fluorene, vinylenephenylene, anthracene, perylene, phenyl, benzyl, chalcone, phthalimide, pamoic acid, acridine, azo compounds, dibenzofuran, any derivatives thereof thiophenes, anthracene, naphthalene, benzene, chalcone, phthalimides, pamoic acid, acridine, azo compounds, chrysenes, pyrenes, fluoranthrenes, anthrones, benzophenones, thioxanthones, heterocyclic aromatic rings containing heteroatoms selected from oxygen, nitrogen, sulfur, and combinations thereof, as well as derivatives of the foregoing.

The alkyl, alkenyl, cycloalkyl, and aralkyl groups of $R_2$ can be unsubstituted or substituted. Suitable substituents include those which, in the context of this invention, do not alter the properties of the groups, such as e.g., a halogen atom (e.g., fluorine, chlorine, bromine, iodine), hydroxy, alkoxy, mercapto, alkylmercapto, nitro, nitroso, cyano, sulfoxy, and the like. Examples of alkyl include methyl, butyl, isoamyl, and the like, alkenyl such as vinyl, allyl, and the like, cycloalkyl such as cyclohexyl, cyclopentyl, adamantyl, and the like, alkoxy such as, for example, methoxy group, ethoxy group, hydroxyethoxy group, propoxy group, hydroxypropoxy group, n-butoxy group, isobutoxy group, sec-butoxy group and t-butoxy group, aralkyl such as benzyl group, phenethyl group and cumyl group, aryloxy such as phenoxy group, and aryloxycarbonyl group such as benzoyloxy group.

Examples of the polymers include poly(phenyl-methylsilsesquioxane), 90:10 phenyl:methyl; poly(phenyl-propylsilsesquioxane), 70:30 phenyl:propyl; poly(phenyl-vinylsilsesquioxane), 90:10 phenyl:vinyl; copolymerized phenylsilsesquioxane-benzylsilsesquioxane, poly(phenyl-isobutylsilsesquioxane), poly(phenyl-isoamylsilsesquioxane), poly(phenyl-n-hexylsilsequioxane), poly(phenyl-benzoylsilsesquioxane), poly(phenyl-p-phenoxysilsesquioxane), poly(naphthyl-methylsilsesquioxane), poly(anthryl-methylsilsesquioxane), (40% phenyl-45% methylsilsesquioxane)-(5% phenylmethylsiloxane)(10% diphenylsiloxane) terpolymer and the like, etc. The polymers can also contain one or more repeating units of formula $(R_f)_w(R_g)_z SiO_{(4-w-z)/2}$, where $R_f$ and $R_g$ are each individually selected from $R_1$ and $R_2$ as described above and w and z are each integers within the limits $0 \leq (w \text{ or } z) \leq 2$ with the proviso that (4−w−z) does not equal 0 or 3.

Another component of the composition is a halide source. The halide source can be just about any material which provides a halide anion to react with the polymer. Depending upon the application of the composition of the present invention, it may be more advantageous to use certain halide sources over other halide sources. Examples of halide sources include aliphatic quaternary ammonium salts (e.g., a tetra$C_{1-6}$ alkylammonium halide such as tetramethylammonium chloride, tetraethylammonium chloride, tetramethylammonium bromide and tetraethylammonium bromide, a tri$C_{1-6}$ alkyl $C_{8-20}$ alkylammonium halide such as trimethyllaurylammonium chloride and trimethyllaurylammonium bromide, a di$C_{1-6}$ alkyldi$C_{8-20}$ alkylammonium halide such as dimethyldilaurylammonium chloride and dimethyldilaurylammonium bromide), especially a tetra$C_{1-4}$ alkylammonium halide (e.g., a tetra$C_{1-2}$ alkylammonium halide), a tri$C_{1-4}$ alkyl$C_{10-16}$ alkylammonium halide (e.g., a tri$C_{1-2}$ alkyl$C_{10-14}$ alkylammonium halide), a di$C_{1-4}$ alkyldi$C_{10-16}$ alkylammonium halide (e.g., a di$C_{1-2}$ alkyldi$C_{10-14}$ alkylammonium halide), aliphatic/aryl quaternary ammonium salts (e.g., benzyltri $C_{1-16}$ alkyl ammonium halide). Examples of these salts include tetrabutylammonium chloride, benzyltrimethylammonium chloride, tetraethylammonium chloride, benzyltributylammonium chloride, cetyltrimethylammonium chloride, methyltrioctylammonium chloride, tetrabutylammonium chloride, benzyltrimethylammonium chloride, as well as the corresponding fluorides, bromides, and iodides.

Other examples of suitable halide sources are diquaternary ammonium dihalide salts such as compounds having the general formula

[(R')$_3$N$^+$(Z)$_m$N$^+$(R')$_3$](X$^-$)$_2$ wherein each R' is individually alkyl of from 1 to 20 carbon atoms, heteroalkyl of from 1 to 20 carbon atoms, aryl, heteroaryl, cycloalkyl of from 3 to 6 carbon atoms, cycloheteroalkyl of from 3 to 6 carbon atoms, or combinations thereof; N is the quadricoordinate element nitrogen, or the heteroatom nitrogen in an alicyclic, heteroalicyclic or heteroaromatic structure X is an anion; Z is a bridging member selected from the group consisting of alkyl of from 1 to 20 carbon atoms, alkenyl of from 2 to 20 carbon atoms, aryl, heteroalkyl of from 1 to 20 carbon atoms, heteroalkenyl of from 2 to 20 carbon atoms and heteroaryl; and m is 1 to 10. Examples of these compounds include [(CH$_3$)$_3$N$^+$(CH$_2$)$_6$N$^+$(CH$_3$)$_3$](Cl$^-$)$_2$, [(C$_3$H$_7$)$_3$N$^+$(CH$_2$)$_6$N$^+$(C$_3$H$_7$)$_3$](Cl$^-$)$_2$, [(CH$_3$)$_3$ N$^+$(C$_2$H$_4$)$_6$N$^+$(CH$_3$)$_3$](Br$^-$)$_2$, [(C$_6$H$_5$)$_3$N$^+$(CH$_2$)$_6$N$^+$(CH$_3$)$_3$](Cl$^-$)$_2$, [(C$_6$H$_5$)$_3$N$^+$(C$_2$H$_4$)$_2$N$^+$(CH$_3$)$_3$](Cl$^-$)$_2$, and the like, etc. Another example of a diquaternary ammonium halide salt is N,N'-difluoro-2,2'-bipyridinium (bistetrafluoroborate) (known as MEC-31). Yet another example is tetrakis(dimethylamino)ethene (TDAE)/CF3 complex.

Other examples of halide sources include tetraalkylammonium dihalotriaryl(or trialkyl or mixtures of aryl and alkyl) disilicate which have the general formula

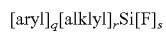

where q is 1 or 2, r is 1 or 2, and s is 2 or 3.

One example is a compound having the formula

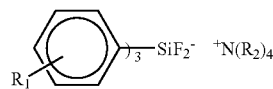

where $R_1$ is zero to three substituents, each of which are independently alkyl, alkenyl, aryl alkanoyl, alkoxy, or nitro; and $R_2$ is an alkyl group, an example being tetrabutylammonium difluorotriphenylsilicate.

Other examples are compounds having the formulae

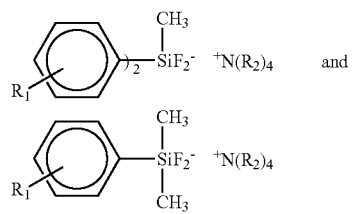

where $R_1$ and $R_2$ are defined above.

These types of salts are more fully described in U.S. Pat. Nos. 6,414,173 and 6,203,721, both of which are incorporated herein by reference.

Additional diquaternary ammonium halide salts are also diquaternary ammonium salts of DABCO (1,4-diazabicyclo[2.2.2]octane), shown by the formula

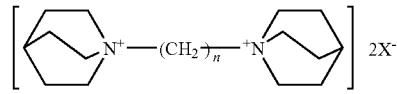

where n is 1 to 10 and X is a halide. These salts are more fully described in U.S. Pat. No. 4,559,213, which is incorporated herein by reference.

Other halide sources include alkali metal salts (e.g., LiCl, NaCl, KCl, KBr, etc), alkaline earth metal salts (e.g., CaCl$_2$, MgCl$_2$, etc), pyridinium salts such as benzyl-3-hydroxypyridinium chloride, imidazolidine salts such as 1,3-didecyl-2-methylimidazolium chloride, tetrazolium salts such as 2,3,5-triphenyl-tetrazolium chloride, and the like, etc. Yet other halide sources include halogenated organic compounds that can release halide by an elimination reaction under heat.

In many instances, the nitrogen atom in the above salts can be replaced with a Group VA element such as phosphorus, antimony, and arsenic, such as tetrabutylphosphonium chloride, tetramethylphosphonium chloride, tetraphenylphosphonium chloride, and the like.

Other halide sources include materials such as 1-fluoro-4-chloromethyl-1,4-diazoniabicyclo[2.2.2]octane bis(tetrafluoroborate) (tradename Selectfluor), 1-fluoro-4-hydroxy-1,4-diazoniabicyclo[2.2.2]octane bis(tetrafluoroborate) (tradename Accufluor), N,N'-difluoro-2,2'-bipyridinium bis(tetrafluoroborate), the 'N—F' reagents (e.g., R$_2$N—F), the '[N—F]$^+$' reagents (e.g., R$_3$N$^+$—F), 2,2-difluoro-1,3-dimethylimidazolidine, diethylaminosulfur trifluoride, R$_a$R$_b$N—CF$_2$—R$_c$, where R$_a$ is hydrogen or alkyl and R$_b$ and R$_c$ are each selected from alkyl or aryl (tradename Fluorinox), perfluorobutanesulfonyl fluoride, and the like, etc.

The halide source is generally present in the composition from about 1 to about 20 percent based on the total resin solids of the composition. Applicants have found that best results of the present invention are achieved when the inventive compositions are allowed to stand for about twenty-four hours before being used to coat substrates, etc.

Another component in the inventive composition is a solvent. Suitable solvents for such photoresists may include for example ketones such as acetone, methyl ethyl ketone, methyl isobutyl ketone, cyclohexanone, isophorone, methyl isoamyl ketone, 2-heptanone 4-hydroxy, and 4-methyl 2-pentanone; $C_1$ to $C_{10}$ aliphatic alcohols such as methanol, ethanol, n-propanol, isopropanol, n-butanol, sec-butanol, phenol, and the like; aromatic group containing-alcohols such as benzyl alcohol; cyclic carbonates such as ethylene carbonate and propylene carbonate; aliphatic or aromatic hydrocarbons (for example, hexane, toluene, xylene, etc and the like); cyclic ethers, such as dioxane and tetrahydrofuran; ethylene glycol; propylene glycol; hexylene glycol; ether alcohols, for example, 1-butoxyethoxy-2-propanol, 3-methyl-3-methoxybutanol, ethylene glycol n-butyl ether, ethylene glycol phenyl ether, ethylene glycol monomethylether, ethylene glycol monoethylether, ethylene glycol propyl ether, diethylene glycol hexyl ether, diethylene glycol monoethyl ether, diethylene glycol monomethyl ether, diethylene glycol monobutyl ether, diethylene glycol monopropyl ether, propylene glycol ethyl ether, propylene glycol isobutyl ether, propylene glycol monomethyl ether, propylene glycol monobutyl ether, propylene glycol monoethyl ether, propylene glycol n-propyl ether, propylene glycol phenyl ether, propylene glycol-t-butyl ether, dipropylene glycol ethyl ether, dipropylene glycol monobutyl ether, dipropylene glycol monomethyl ether, dipropylene glycol monopropyl ether, triethylene glycol ethyl ether, triethylene glycol methyl ether, triethylene glycol n-butyl ether, tripropylene glycol methyl ether, tripropylene glycol n-butyl ether; ethylene glycol alkylether acetates such as methylcellosolve acetate and ethylcellosolve acetate; propylene glycol alkyletheracetates such as propylene glycol methylether acetate, propylene glycol ethylether acetate, propylene glycol propylether acetate, and propylene glycol butylether acetate; propylene glycol alkyletherpropionates such as propylene glycol methyletherpropionate, propylene glycol ethyletherpropionate, propylene glycol propyletherpropionate, and propylene glycol butyletherpropionate; 2-methoxyethyl ether (diglyme); solvents that have both ether and hydroxy moieties such as methoxy butanol, ethoxy butanol, methoxy propanol, and ethoxy propanol; esters such as methyl acetate, ethyl acetate, propyl acetate, and butyl acetate methyl-pyruvate, ethyl pyruvate; ethyl 2-hydroxy propionate, methyl 2-hydroxy 2-methyl propionate, ethyl 2-hydroxy 2-methyl propionate, methyl hydroxy acetate, ethyl hydroxy acetate, butyl hydroxy acetate, methyl lactate, ethyl lactate, propyl lactate, butyl lactate, methyl 3-hydroxy propionate, ethyl 3-hydroxy propionate, propyl 3-hydroxy propionate, butyl 3-hydroxy propionate, methyl 2-hydroxy 3-methyl butanoic acid, methyl methoxy acetate, ethyl methoxy acetate, propyl methoxy acetate, butyl methoxy acetate, methyl ethoxy acetate, ethyl ethoxy acetate, propyl ethoxy acetate, butyl ethoxy acetate, methyl propoxy acetate, ethyl propoxy acetate, propyl propoxy acetate, butyl propoxy acetate, methyl butoxy acetate, ethyl butoxy acetate, propyl butoxy acetate, butyl butoxy acetate, methyl 2-methoxy propionate, ethyl 2-methoxy propionate, propyl 2-methoxy propionate, butyl 2-methoxy propionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, and butyl 3-butoxypropionate; oxyisobutyric acid esters, for example, methyl-2-hydroxyisobutyrate, methyl α-methoxyisobutyrate, ethyl methoxyisobutyrate, methyl α-ethoxyisobutyrate, ethyl α-ethoxyisobutyrate, methyl β-methoxyisobutyrate, ethyl β-methoxyisobutyrate, methyl β-ethoxyisobutyrate, ethyl β-ethoxyisobutyrate, methyl β-isopropoxyisobutyrate, ethyl β-isopropoxyisobutyrate, isopropyl β-isopropoxyisobutyrate, butyl β-isopropoxyisobutyrate, methyl β-butoxyisobutyrate, ethyl β-butoxyisobutyrate, butyl β-butoxyisobutyrate, methyl α-hydroxyisobutyrate, ethyl α-hydroxyisobutyrate, isopropyl α-hydroxyisobutyrate, and butyl α-hydroxyisobutyrate; and other solvents such as dibasic esters, and gamma-butyrolactone; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof. It has been found that for enhanced stability and/or solubility, solvents selected from alcohols and ether alcohols are preferred.

An optional component which can be added to the composition is a porogen, which can be used to reduce the dielectric constant of film formed by the inventive composition. As used herein, by "porogen" is meant any pore-generating compounds, for example, a thermal- and/or radiation-labile organic polymer capable of decomposition to small molecules and subsequent volatilization to form a nanopore thereby). The conditions for forming such porous low-k dielectric layers are well known to those skilled in the art.

The composition of the present invention can be coated on the substrate using techniques well known to those skilled in the art, such as dipping, spincoating or spraying. The film thickness of the anti-reflective coating ranges from about 0.01 μm to about 1 μm. The coating can be heated on a hot plate or convection oven or other well known heating methods to remove any residual solvent and induce crosslinking if desired, and insolubilizing the anti-reflective coatings to prevent intermixing between the anti-reflective coating and the photoresist.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Negative working photoresist and positive working photoresist compositions and their use are well known to those skilled in the art.

A process of the instant invention comprises coating a substrate with a composition of the present invention and heating the substrate on a hotplate or convection oven or other well known heating methods at a sufficient temperature for sufficient length of time to remove the coating solvent, and crosslink the polymer, to a sufficient extent so that the coating is not soluble in the coating solution of a photoresist or in a aqueous alkaline developer. An edge bead remover may be applied to clean the edges of the substrate using processes well known in the art. The heating ranges in temperature from about 70° C. to about 250° C. If the temperature is below 70° C. then insufficient loss of solvent or insufficient amount of crosslinking may take place, and at temperatures above 250° C., the polymer may become chemically unstable. A film of a photoresist composition is then coated on top of the anti-reflective coating and baked to substantially remove the photoresist solvent. The photoresist is image-wise exposed and developed in an aqueous developer to remove the treated resist. An optional heating step can be incorporated into the process prior to development and after exposure. The process of coating and imaging photoresists is well known to those skilled in the art and is optimized for the specific type of resist used. The patterned substrate can then be dry etched in a suitable etch chamber to remove the exposed portions of the anti-reflective film, with the remaining photoresist acting as an etch mask.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

Example 1

Poly(phenyl-methylsilsesquioxane) 90:10 phenyl:methyl, was obtained from Gelest. A solution of 2.5 weight % of poly(phenyl-methylsilsesquioxane) 90:10 phenyl:methyl in propylene glycol monomethyl ether was made. Varying amounts of tetrabutylammonium chloride, from 2 weight % to 10 weight % based on the solid content of the poly(phenyl-methylsilsesquioxane), were added to aliquots of the solution and mixed. The aliquots were allowed to stand for 24 hours. Aliquots of each solution were then placed on different silicon wafers and spun cast at 2000 rpm to form film thicknesses of 60 nm (when measured after heating). The coated wafers were then heated at 250° C. The film thickness was measured by VASE. The coated wafers were then soaked in propylene glycol monomethyl ether acetate for 30 seconds and the film thickness was measure on a VASE. As the amount of tetrabutylammonium chloride was increased from 0 weight % to 10 weight %, there was complete film loss at 0 weight % of tetrabutylammonium chloride and then from 2.5 weight % to 10 weight % of tetrabutylammonium chloride, the film thickness loss ranged from 2 to 3.5 nm.

Example 2

Ten grams of poly(phenyl-propylsilsesquioxane) [70:30 phenyl:propyl; available from Gelest, Inc., Morrisville, Pa.] and 130 g of ethyl lactate were combined by stirring in a bottle. After letting the formulation stand for one day, an aliquot of the formulation was spin coated onto a silicon wafer and the wafer was heated to 200° C. The film was tested for solubility by submerging part of the wafer in PGMEA. All of the film was removed in the soaked regions. This test was repeated using 250 and 300° C. bakes and the results were the same.

Example 3

Five grams of poly(phenyl-propylsilsesquioxane) [70:30 phenyl:propyl; available from Gelest, Inc., Morrisville, Pa.], 95 g of ethyl lactate and 0.25 g of tetrabutylammonium difluorotriphenylsilicate were combined with mixing in a suitable bottle. After letting the formulation stand for one day, an aliquot of the formulation was spin coated onto a silicon wafer and the wafer was heated to 150° C. The film was tested for solubility by submerging part of the wafer in PGMEA. All film in the soaked area remained. When higher temperatures were used to bake the films, the films in the soaked areas were not affected. When the wafer was not baked, the film is completely removed.

Example 4

Five grams of poly(phenyl-propylsilsesquioxane) [70:30 phenyl:propyl; available from Gelest, Inc., Morrisville, Pa.], 100 g of ArF thinner (available from AZ Electronic Materials) and 0.25 g of tetrabutylammonium fluoride were combined with mixing in a suitable bottle. After letting the formulation stand for one day, an aliquot of the formulation was spin coated onto a silicon wafer and the wafer was heated to 250° C. The film was tested for solubility by submerging part of the wafer in PGMEA. All film in the soaked area remained. When higher temperatures were used to bake the films, the films in the soaked areas were not affected. When the wafer was not baked, the film is completely removed.

Example 5

Two ml aliquots of Example 1 were placed into suitable bottles and four different formulations were made by adding varying amounts of a 5% solution of tetrabutylammonium chloride (TBAC) in PGME with stirring: (a) 0 drop of 5% solution of TBAC [control]; (b) 1 drop of 5% solution of TBAC; (c) 5 drops of 5% solution of TBAC; and (d) 15 drops of 5% solution of TBAC. After letting the formulations stand for one day, aliquots of each formulation were spin coated onto a silicon wafer and the wafer was heated to 250° C. The film formed by each aliquot of formulation was tested for solubility by submerging part of the wafer in PGMEA. Except for the formulation with no TBAC ((a); control), all other films remained intact and were cured.

The invention claimed is:

1. A composition comprising:
  (a) a polymer comprising at least one repeating unit of formula $((A)_jR_1SiO_{(3-j)/2})$ and at least one repeating unit of formula $((A)_kR_2SiO_{(3-k)/2})$, where each $R_1$ individually is the same or different chromophore which absorbs at any actinic wavelength; each $R_2$ is individually selected from hydrogen, alkyl, alkenyl, and cycloalkyl; each A is an unreacted functional group of a monomer which forms either of the above repeating units; j and k are each integers that fall within the range $0 \leq j \leq 1$ and $0 \leq k \leq 1$, the ratio of $R_1$ to $R_2$ being from about 1:99 to about 60:40;

(b) a halide source which can react with the polymer and is selected from a fluoride and halogenated organic compound that can release halide under heat; and (c) a solvent.

2. The composition of claim 1, wherein the ratio of $R_1$ to $R_2$ is from about 10:90 to about 30:70.

3. The composition of claim 1, wherein $R_2$ is alkyl or alkenyl.

4. The composition of claim 1, wherein $R_1$ is selected from unsubstituted and substituted fluorene, vinylenephenylene, anthracene, perylene, phenyl, chalcone, phthalimide, pamoic acid, acridine, am compounds, dibenzofuran, and any derivatives thereof, thiophenes, naphthoic acid, anthracene, naphthalene, benzene, chalcone, phthalimides, pamoic acid, acridine, azo compounds, chrysenes, pyrenes, fluoranthrenes, anthrones, benzophenones, thioxanthones, heterocyclic aromatic rings containing heteroatoms selected from oxygen, nitrogen, sulfur, and combinations thereof, as well as derivatives of the foregoing.

5. The composition of claim 1, which further comprises a porogen.

6. The composition of claim 1, wherein the polymer further comprises a unit of formula $(R_f)_w(R_g)_z SiO_{(4-w-z)/2}$, where $R_f$ and $R_g$ are each individually selected from $R_1$ and $R_2$; and w and z are each integers within the limits $0 \leq (w \text{ or } z) \leq 2$ with the proviso that $(4-w-z)$ does not equal 0.

7. The composition of claim 1, wherein the halide source is a quaternary ammonium halide salt or a diquaternary ammonium halide salt.

8. The composition of claim 1, wherein the halide source is a tetrabutylammonium fluoride, benzyltrimethylammonium fluoride, tetraethylammonium fluoride, benzyltributylammonium fluoride, cetyltrimethylammonium fluoride, methyltrioctylammonium fluoride, tetrabutylammonium fluoride, benzyltrimethylammonium fluoride.

9. The composition of claim 1, wherein the halide source is $[\text{aryl}]_q[\text{alklyl}]_r Si[F]_s$ where q is 1 or 2, r is 1 or 2, and s is 2 or 3.

10. The composition of claim 1, wherein the halide is a fluoroborate.

11. The composition of claim 7, wherein the halide source is

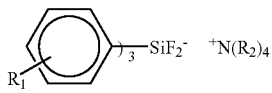

where $R_1$ is zero to three substituents, each of which are independently alkyl, alkenyl, aryl alkanoyl, alkoxy, or nitro; and $R_2$ is an alkyl group.

12. The composition of claim 1, wherein the halide source is present in an amount of from about 1 to about 20 percent based on the total resin solids of the composition.

13. A method of forming an image on a substrate comprising, a) coating the substrate with the composition of claim 1; b) heating the coating of step a); c) forming a coating from a photoresist solution on the coating of step b); d) heating the photoresist coating to substantially remove solvent from the coating; e) image-wise exposing the photoresist coating; f) developing an image using an aqueous alkaline developer; g) optionally, heating the substrate prior to and after development; and h) dry etching the composition of step b).

14. The method of claim 13, wherein for the composition in a), the ratio of $R_1$ to $R_2$ is from about 10:90 to about 30:70.

15. The method of claim 13, wherein for the composition in a), $R_2$ is alkyl or alkenyl.

16. The method of claim 13, wherein for the composition in a), $R_1$ is selected from unsubstituted and substituted fluorene, vinylenephenylene, anthracene, perylene, phenyl, chalcone, phthalimide, pamoic acid, acridine, azo compounds, dibenzofuran, and any derivatives thereof, thiophenes, naphthoic acid, anthracene, naphthalene, benzene, chalcone, phthalimides, pamoic acid, acridine, azo compounds, chrysenes, pyrenes, fluoranthrenes, anthrones, benzophenones, thioxanthones, heterocyclic aromatic rings containing heteroatoms selected from oxygen, nitrogen, sulfur, and combinations thereof, as well as derivatives of the foregoing.

17. The method of claim 13, wherein the composition in a further comprises a porogen.

18. The method of claim 13, wherein far the composition in a), the polymer further comprises a unit of formula $(R_f)(R_g)_z SiO_{(4-w-z)/2}$, where $R_f$ and $R_g$ are each individually selected from $R_1$ and $R_2$; and w and z are each integers within the limits $0 \leq (w \text{ or } z) \leq 2$ with the proviso that $(4-w-z)$ does not equal 0.

19. The method of claim 13, wherein for the composition in a), the halide source is a quaternary ammonium halide salt or a diquaternary ammonium halide salt.

20. The method of claim 13, wherein for the composition in a), the halide source is a quaternary ammonium halide salt.

21. The method of claim 20, wherein the quaternary ammonium halide salt is a tetra$C_{1-10}$ammonium halide.

22. The method of claim 21, wherein the quaternary ammonium halide salt is tetrabutylammonium chloride.

23. The method of claim 13, wherein the halide source is a diquaternary ammonium halide salt.

24. The method of claim 13, wherein for the composition in a), the halide source is present in an amount of from about 1 to about 20 weight percent based on the total resin solids of the composition.

25. An article of manufacture comprising: a substrate; an antireflective composition on the substrate, the antireflective composition being that of claim 1; and a layer of a photoresist composition over the antireflective composition.

* * * * *